(12) United States Patent
Enokida et al.

(10) Patent No.: US 9,082,800 B2
(45) Date of Patent: Jul. 14, 2015

(54) SUBSTRATE TREATMENT SYSTEM, SUBSTRATE TRANSFER METHOD AND NON-TRANSITORY COMPUTER-READABLE STORAGE MEDIUM

(71) Applicant: Tokyo Electron Limited, Tokyo (JP)

(72) Inventors: Suguru Enokida, Koshi (JP); Masahiro Nakaharada, Koshi (JP); Hidekazu Kiyama, Koshi (JP); Naruaki Iida, Koshi (JP); Akira Miyata, Koshi (JO)

(73) Assignee: Tokyo Electron Limited, Tokyo (JP)

( * ) Notice: Subject to any disclaimer, the term of this patent is extended or adjusted under 35 U.S.C. 154(b) by 155 days.

(21) Appl. No.: 13/623,189

(22) Filed: Sep. 20, 2012

(65) Prior Publication Data

US 2013/0078061 A1  Mar. 28, 2013

(30) Foreign Application Priority Data

Sep. 22, 2011  (JP) ................................. 2011-207463
Sep. 22, 2011  (JP) ................................. 2011-207466

(51) Int. Cl.
  *H01L 21/677*  (2006.01)
  *H01L 21/67*  (2006.01)
  *H01L 21/687*  (2006.01)

(52) U.S. Cl.
  CPC .... *H01L 21/67766* (2013.01); *H01L 21/67155* (2013.01); *H01L 21/67178* (2013.01); *H01L 21/67769* (2013.01); *H01L 21/68707* (2013.01)

(58) Field of Classification Search
  CPC . H01L 21/67; H01L 21/677; H01L 21/67745; H01L 21/67155; H01L 21/67184
  USPC ............ 414/222.01, 222.07, 222.09, 222.13, 414/226.01, 226.03, 226.05, 266, 935–941
  See application file for complete search history.

(56) References Cited

U.S. PATENT DOCUMENTS

| | | | | |
|---|---|---|---|---|
| 6,008,978 A * | 12/1999 | Tateyama | ....................... | 361/212 |
| 6,299,363 B1 * | 10/2001 | Ueda | .............................. | 396/611 |
| 6,461,438 B1 * | 10/2002 | Ookura et al. | ................ | 118/724 |
| 7,357,842 B2 * | 4/2008 | Ishikawa et al. | .............. | 118/503 |
| 7,651,306 B2 * | 1/2010 | Rice et al. | ..................... | 414/217 |
| 8,019,467 B2 * | 9/2011 | Hongkham et al. | .......... | 700/228 |

(Continued)

FOREIGN PATENT DOCUMENTS

| | | |
|---|---|---|
| JP | 10-284568 A | 10/1998 |
| JP | 2002-313769 A | 10/2002 |
| JP | 2003-309160 A | 10/2003 |
| JP | 2005-243776 A | 9/2005 |

(Continued)

*Primary Examiner* — Saul Rodriguez
*Assistant Examiner* — Ashley Romano
(74) *Attorney, Agent, or Firm* — Posz Law Group, PLC

(57) ABSTRACT

A substrate treatment system comprise a treatment station having a plurality of treatment units provided at multiple tiers in an up-down direction, a cassette mounting table on which a cassette housing a plurality of wafers W is mounted, and a wafer transfer mechanism arranged between the treatment station and the cassette mounting table, wherein a delivery block in which a plurality of delivery units are provided at multiple tiers is provided between the treatment station and the wafer transfer mechanism, the delivery units temporarily housing a wafer to be transferred between the cassette mounting table and the treatment station and a wafer to be transferred between the tiers of the treatment units. The wafer transfer mechanism includes a first transfer arm that transfers a wafer between the cassette mounting table and the delivery block, and a second transfer arm that transfers a wafer between the tiers of the delivery units.

20 Claims, 15 Drawing Sheets

(56) References Cited

U.S. PATENT DOCUMENTS

| | | | |
|---|---|---|---|
| 2009/0000543 A1* | 1/2009 | Fukutomi et al. | 118/58 |
| 2009/0120362 A1* | 5/2009 | Hamada | 118/686 |
| 2010/0068009 A1* | 3/2010 | Kimura et al. | 414/217.1 |
| 2011/0029122 A1* | 2/2011 | Kaneko et al. | 700/110 |
| 2011/0076120 A1* | 3/2011 | Itou | 414/222.13 |
| 2014/0285790 A1* | 9/2014 | Nishiyama | 355/72 |

FOREIGN PATENT DOCUMENTS

| | | |
|---|---|---|
| JP | 2007-288029 A | 11/2007 |
| JP | 2009-231627 A | 10/2009 |
| JP | 2009-260087 A | 11/2009 |
| JP | 2009-278027 A | 11/2009 |
| JP | 2010-129603 A | 6/2010 |
| JP | 2010-199355 A | 9/2010 |

* cited by examiner

SUBSTRATE TREATMENT SYSTEM, SUBSTRATE TRANSFER METHOD AND NON-TRANSITORY COMPUTER-READABLE STORAGE MEDIUM

BACKGROUND OF THE INVENTION

1. Field of the Invention

The present invention relates to a substrate treatment system performing treatment on a substrate, a substrate transfer method in the substrate treatment system and a non-transitory computer storage medium.

2. Description of the Related Art

For example, in a photolithography process in manufacturing processes of a semiconductor device, a series of treatments such as resist coating treatment of applying a resist solution onto a wafer to form a resist film, exposure processing of exposing the resist film to a predetermined pattern, developing treatment of developing the exposed resist film and so on are sequentially performed, whereby a predetermined resist pattern is formed on the wafer. The series of treatments are performed in a coating and developing treatment system being a substrate treatment system in which various kinds of treatment units treating the wafer and transfer units transferring the wafer are installed.

For example, a coating and developing treatment system 200 conventionally includes a cassette station 201 for transferring a cassette C in/out from/to the outside, a treatment station 202 in which a plurality of treatment units that perform various treatments such as resist coating treatment, developing treatment, and thermal treatment are provided at multiple tiers, and an interface station 203 that delivers a wafer between an exposure unit E and the treatment station 202 adjacent thereto, which are integrally provided as illustrated in FIG. 18 (Patent Document 1).

In the cassette station 201, cassette mounting plates 210 on which cassettes C transferred in from the outside are mounted, and a wafer transfer mechanism 211 that transfers the wafers between the cassettes C on the cassette mounting plates 210 and the treatment station 202 is provided. Further, on the cassette station 201 side in the treatment station 202, a delivery block 212 that temporarily houses substrates to be transferred from the cassette mounting plates 210 to the treatment station and substrates to be transferred between tiers of the treatment units is provided. In the delivery block 212, delivery units (not illustrated) that temporarily mount wafers thereon are provided at multiple tiers in the up-down direction. In the delivery block 212, another wafer transfer mechanism 213 that exclusively transfers a wafer between tiers at the delivery units is provided adjacent to the delivery block 212.

At the time when the wafer treatment is performed in the coating and developing treatment system 200, a cassette C housing a plurality of wafers in one lot is mounted first on a predetermined cassette mounting plate 210. Then, the wafers in the cassette C are successively transferred by the wafer transfer mechanism 211 to the delivery block 212. Each of the wafers is then transferred to the treatment station 202 and the exposure unit E and treated, and the wafer for which treatment has been finished is returned by the wafer transfer mechanism 211 from the treatment station 202 to the cassette C on the cassette mounting plate 210.

Japanese Laid-open Patent Publication No. 2009-278027

SUMMARY OF THE INVENTION

In recent years, however, the coating and developing treatment system needs to be reduced in footprint that is the ratio of the coating and developing treatment system occupying the clean room floor area.

To reduce the footprint, it is necessary to downsize the treatment units and reduce the space required for wafer transfer. However, there are many constraints in downsizing of the treatment units because the configurations themselves of the treatment units need to be reviewed.

On the other hand, when the space required for wafer transfer is reduced, it can be proposed that, for example, the arrangement of the delivery block 212 is changed to be closer to the cassette mounting plate 210 than ever before, so as to shorten the treatment station 202. However, another wafer transfer mechanism 213 for transferring the wafer between the tiers of the delivery units needs to be provided adjacent to the delivery block 212, and therefore the delivery block 212 also has a constraint in terms of arrangement. Therefore, there is a limit in change of the arrangement of the delivery block 212.

The present invention has been made in consideration of the above points and its object is to reduce the footprint of the substrate treatment system.

To achieve the above object, the present invention is a substrate treatment system including a treatment station having a plurality of treatment units which treat a substrate provided at multiple tiers in an up-down direction, a cassette mounting part on which a cassette housing a plurality of substrates is mounted, and a substrate transfer mechanism arranged between the treatment station and the cassette mounting part, wherein a plurality of delivery units are provided at multiple tiers between the treatment station and the substrate transfer mechanism, the delivery units temporarily housing a substrate to be transferred between the cassette mounting part and the treatment station and a substrate to be transferred between the tiers of the treatment units, and wherein the substrate transfer mechanism includes a first transfer arm that transfers a substrate between the cassette mounting part and each of the delivery units, and a second transfer arm that transfers a substrate between the tiers of the delivery units.

According to the present invention, the substrate transfer mechanism arranged between the treatment station and the cassette mounting part has the first transfer arm and the second transfer arm, so that both of substrate transfer between the cassette mounting part and the delivery unit and substrate transfer between the tiers of the delivery units can be implemented by the substrate transfer mechanism. Therefore, the substrate transfer mechanism which has been conventionally provided for exclusive use for the substrate transfer between the tiers of the delivery units becomes unnecessary. Consequently, the constraint when changing the arrangement of the delivery block closer to the cassette mounting part is eliminated and the delivery block can be arranged closer to the cassette mounting part than ever before. Therefore, according to the present invention, the footprint of the substrate treatment system can be reduced.

The present invention according to another aspect is a substrate transfer method in a substrate treatment system including a treatment station having a plurality of treatment units which treat a substrate provided at multiple tiers in an up-down direction, a cassette mounting part on which a cassette housing a plurality of substrates is mounted, and a substrate transfer mechanism arranged between the treatment station and the cassette mounting part, wherein a plurality of delivery units are provided at multiple tiers between the treatment station and the substrate transfer mechanism, the delivery units temporarily housing a substrate to be transferred between the cassette mounting part and the treatment station and a substrate to be transferred between the tiers of the treatment units, and wherein substrate transfer between the cassette mounting part and each of the delivery units is performed by a first transfer arm of the substrate transfer mechanism, and substrate transfer between the tiers of the delivery units is performed by a second transfer arm of the substrate transfer mechanism.

The present invention according to still another aspect is a non-transitory computer-readable storage medium storing a program operating on a computer of a control unit controlling a substrate treatment system to cause the substrate treatment system to execute a substrate transfer method in the substrate treatment system including a treatment station having a plurality of treatment units which treat a substrate provided at multiple tiers in an up-down direction, a cassette mounting part on which a cassette housing a plurality of substrates is mounted, and a substrate transfer mechanism arranged between the treatment station and the cassette mounting part, wherein a plurality of delivery units are provided at multiple tiers between the treatment station and the substrate transfer mechanism, the delivery units temporarily housing a substrate to be transferred between the cassette mounting part and the treatment station and a substrate to be transferred between the tiers of the treatment units, wherein substrate transfer between the cassette mounting part and each of the delivery units is performed by a first transfer aim of the substrate transfer mechanism, and substrate transfer between the tiers of the delivery units is performed by a second transfer arm of the substrate transfer mechanism.

According to the present invention, it is possible to reduce the footprint of the substrate treatment system.

DETAILED DESCRIPTION OF THE INVENTION

Figure 1:
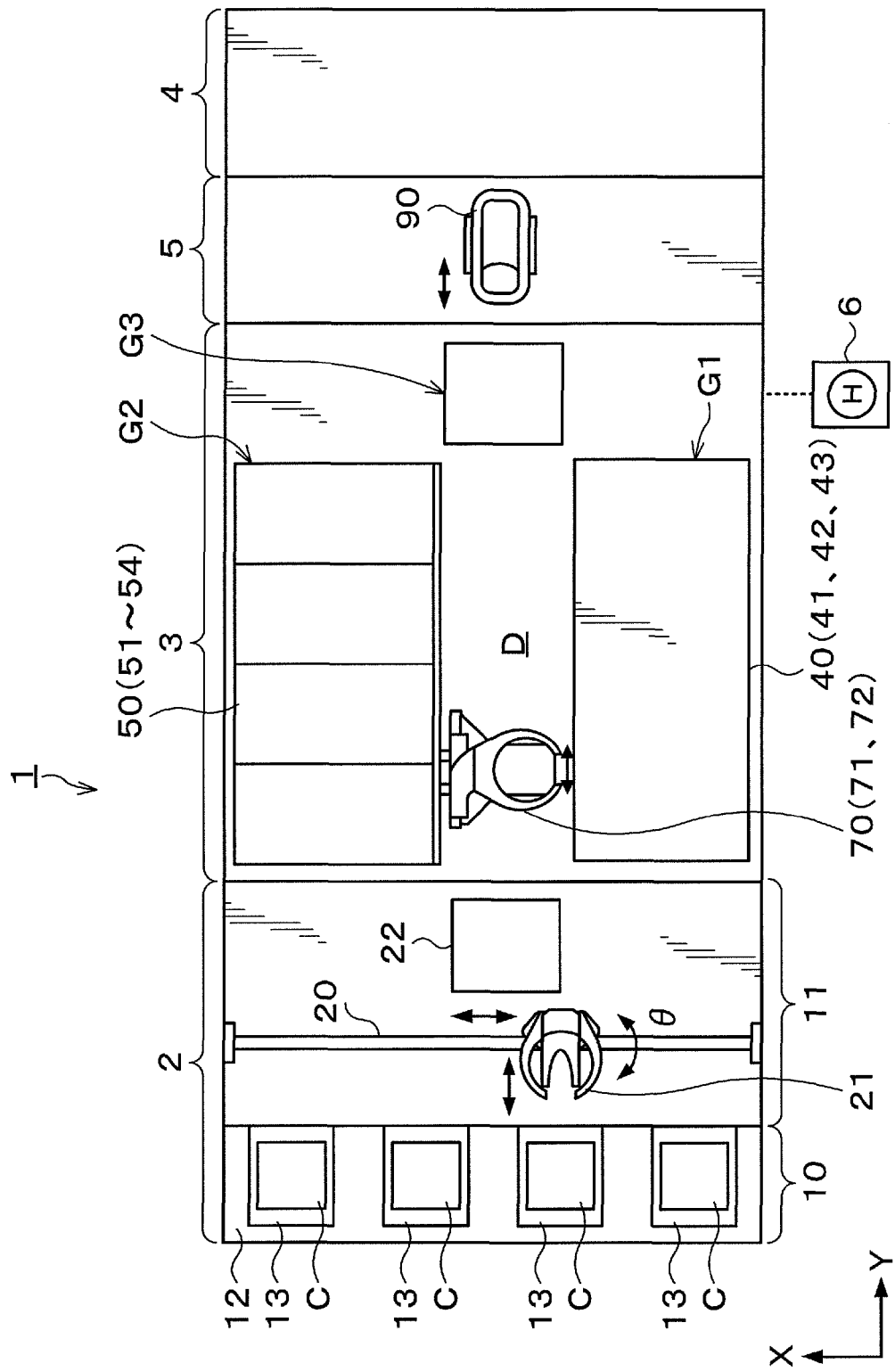
FIG. 1 is a plan view illustrating the outline of an internal configuration of a substrate treatment system according to this embodiment.
Figure 2:
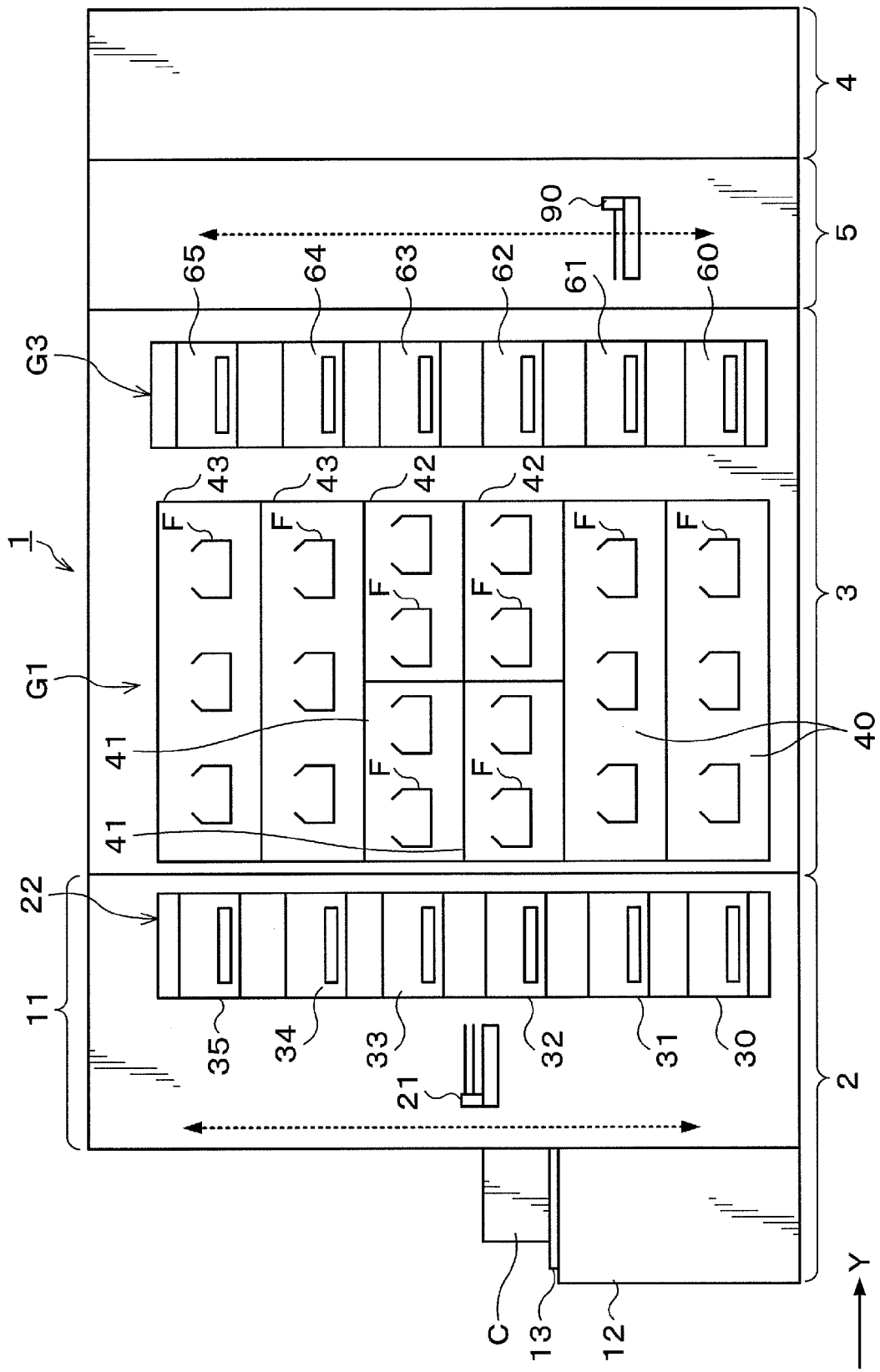
FIG. 2 is a side view illustrating the outline of the internal configuration of the substrate treatment system according to this embodiment.
Figure 3:
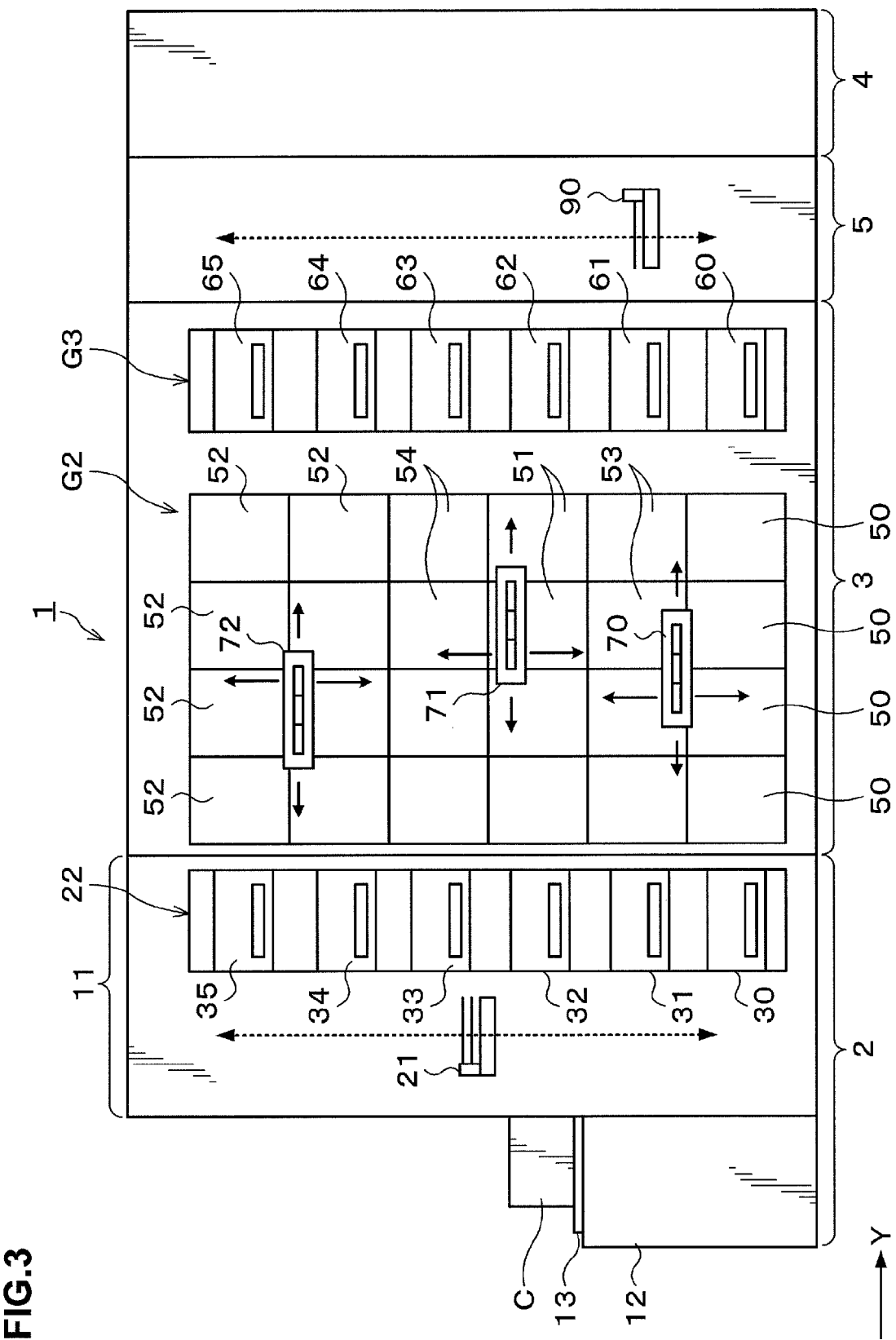
FIG. 3 is a side view illustrating the outline of the internal configuration of the substrate treatment system according to this embodiment.

Hereinafter, embodiments of the present invention will be described. FIG. 1 is a plan view illustrating the outline of an internal configuration of a substrate treatment system 1 according to this embodiment. FIG. 2 and FIG. 3 are side views illustrating the outline of the internal configuration of the substrate treatment system 1. Note that the case in which the substrate treatment system 1 is a coating and developing treatment system that performs photolithography processing on a substrate will be described as an example in this embodiment.

The substrate treatment system 1 has, as illustrated in FIG. 1, a configuration in which, for example, a cassette station 2 to/from which a cassette C housing a plurality of wafers W therein is transferred in/out from/to the outside, a treatment station 3 including a plurality of various kinds of treatment units that perform predetermined treatments in the photolithography processing, and an interface station 5 that delivers the wafers W to/from an exposure unit 4 adjacent to the treatment station 3, are integrally connected together. Further, the substrate treatment system 1 has a control unit 6 that performs control on various treatment units.

The cassette station 2 is composed of, for example, a cassette transfer-in/out section 10 and a wafer transfer section 11. The cassette transfer-in/out section 10 is provided, for example, at the end on a Y-direction negative direction (the left direction in FIG. 1) side in the substrate treatment system 1. In the cassette transfer-in/out section 10, a cassette mounting table 12 as a cassette mounting part is provided. On the cassette mounting table 12, for example, four cassette mounting plates 13 are provided. The cassette mounting plates 13 are provided side by side in a line in an X-direction (an up-down direction in FIG. 1) being the horizontal direction. On the cassette mounting plates 13, cassettes C can be mounted when the cassettes C are transferred in/out from/to the outside of the substrate treatment system 1.

In the wafer transfer section 11, a wafer transfer mechanism 21 movable on a transfer path 20 extending in the X-direction and a delivery block 22 are provided as illustrated in FIG. 1. In the delivery block 22, delivery units 30 to 35 each of which temporarily houses a substrate to be transferred between the cassette mounting plate 13 and the treatment station 3 are provided at multiple tiers in order from the bottom to the top as illustrated in FIG. 2 and FIG. 3. The operation of the wafer transfer mechanism 21 is controlled by the control unit 6.

The wafer transfer mechanism 21 is movable also in the up-down direction and around the vertical axis (in a θ-direction) and can transfer the wafer W between the cassette C on each of the cassette mounting plates 13 and each of the delivery units 30 to 35 in the delivery block 22 and between the tiers of the delivery units 30 to 35. Note that the detailed configurations of the wafer transfer mechanism 21 and the delivery units 30 to 35 will be described later.

In the treatment station 3 adjacent to the cassette station 2, a plurality of, for example, three blocks G1, G2, G3 are provided each of which includes various kinds of units. On the front side (an X-direction negative direction side in FIG. 1) in the treatment station 3, the first block G1 is provided, and on the back side (an X-direction positive direction side in FIG. 1) in the treatment station 3, the second block G2 is provided. Further, on the interface station 5 side (a Y-direction positive direction side in the in FIG. 1) in the treatment station 3, the third block G3 is provided.

For example, in the first block G1, a plurality of solution treatment units are arranged stacked in order from the bottom to the top according to the order of treatments on the wafer W and in order from the cassette station 2 side to the interface station 5 side (the Y-direction positive direction side in the in FIG. 1).

Specifically, as illustrated, for example, in FIG. 2, lower anti-reflection film forming units 40 each of which forms an anti-reflection film under a resist film of the wafer W (hereinafter, referred to as a "lower anti-reflection film") are arranged at two upper and lower tiers at the lowermost tiers. On top of them, resist coating units 41 each of which applies a resist solution onto the wafer W to form a resist film, and upper anti-reflection film forming units 42 each of which forms an anti-reflection film on top of the resist film of the wafer W (hereinafter, referred to as an "upper anti-reflection film") are arranged side by side in the horizontal direction. The units 41, 42 are arranged at two tiers each in the up-down direction. The upper anti-reflection film forming units 42 are provided on the side closer to the interface station 5 (on the Y-direction positive direction side in the in FIG. 1) in the treatment station 3 than are the resist coating units 41. Further, on top of the resist coating unit 41 and the upper anti-reflection film forming unit 42, developing treatment units 43 each of which performs developing treatment on the wafer W after exposure are arranged at two upper and lower tiers. Note that, for example, protective film coating units each of which forms a water-repellent protective film on top of the resist film may be arranged in place of the upper anti-reflection film forming units 42.

Each of the aforementioned units 40 to 43 has a plurality of cups F each of which houses the wafer W therein during treatment in the horizontal direction as illustrated in FIG. 2 to be able to treat a plurality of wafers W in parallel.

For example, in the second block G2, as illustrated in FIG. 3, thermal treatment units 50 to 52 each of which performs thermal treatment on the wafer W, and adhesion units 53 each of which performs hydrophobic treatment on the wafer W, and edge exposure units 54 each of which exposes the outer peripheral portion of the wafer W are arranged one on top of the other in the vertical direction and side by side in the horizontal direction according to the order of treatments on the wafer W similarly to the aforementioned treatment units 40 to 43. Each of the thermal treatment units 50 to 52 has a thermal plate that mounts and heats the wafer W thereon and a cooling plate that mounts and cools the wafer W thereon so as to be able to perform both heat treatment and cooling treatment.

For example, in the third block G3, a plurality of delivery units 60 to 65 are provided in order from the bottom.

A wafer transfer region D is formed in a region surrounded by the delivery block 22 and the first block G1 to the third block G3 as illustrated in FIG. 1. In the wafer transfer region D, for example, a plurality of wafer transfer mechanisms 70 to 72 are provided in order from the bottom as illustrated in FIG. 3. Each of the wafer transfer mechanisms 70 to 72 has a transfer arm that is movable, for example, in the Y-direction, the X-direction, the θ-direction, and the vertical direction. The wafer transfer mechanisms 70 to 72 can move in the wafer transfer region D and transfer the wafers W, for example, to predetermined units at the similar levels in the delivery block 22, the first block G1, the second block G2, and the third block G3 therearound.

In the interface station 5, a wafer transfer mechanism 90 is provided. The wafer transfer mechanism 90 has a transfer arm that is movable, for example, in the forward and backward direction, the θ-direction, and the up-down direction. The wafer transfer mechanism 90 can transfer the wafer W between each of the delivery units in the third block G3 and the exposure unit 4 while supporting the wafer W by the transfer arm.

Figure 4:
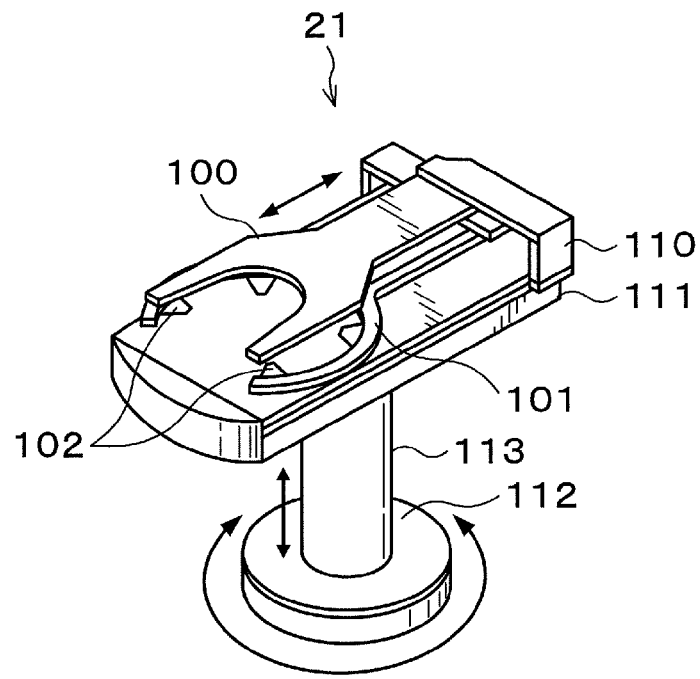
FIG. 4 is a perspective view illustrating the outline of a configuration of a wafer transfer mechanism.
Figure 5:
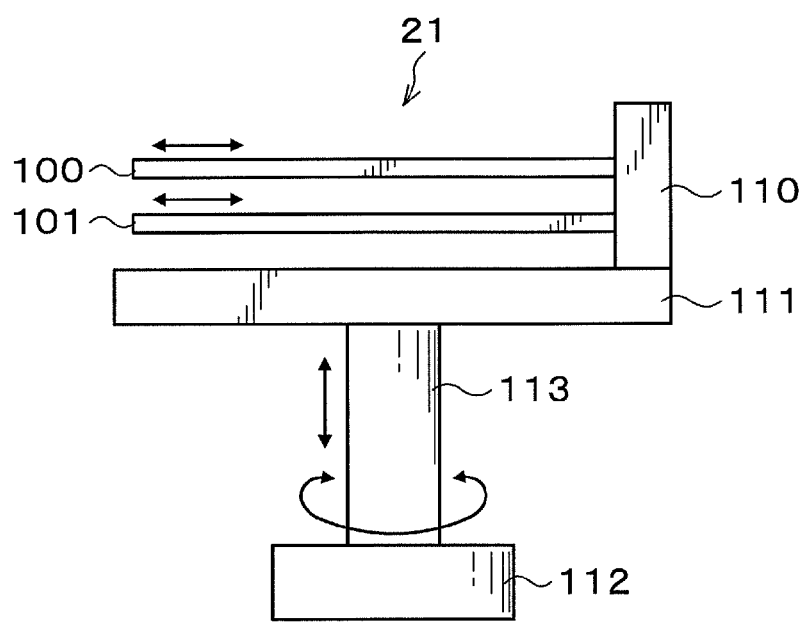
FIG. 5 is a side view illustrating the outline of the configuration of the wafer transfer mechanism.

Next, the aforesaid wafer transfer mechanism 21 and the delivery units 30 to 35 will be described. FIG. 4 is a perspective view illustrating the outline of the configuration of the wafer transfer mechanism 21, and FIG. 5 is a side view illustrating the outline of the configuration of the wafer transfer mechanism 21.

The wafer transfer mechanism 21 has a first transfer arm 100 and a second transfer arm 101 which are arranged one above the other in the up-down direction. The first transfer arm 100 has an almost U-shape in which its tip is branched off into two parts, and can transfer the wafer W between the cassette C and the delivery block 22. In the upper surface of the first transfer arm 100, a suction hole (not illustrated) for suction-holding the wafer W is provided.

The second transfer arm 101 has a shape of an almost ¾-circle (a C-shape) with a diameter larger than that of the wafer W and can deliver the wafer W in the up-down direction between the tiers in the delivery block 22. At the second transfer arm 101, holding parts 102 projecting toward the inside of the second transfer arm 101 are provided, for example, at four positions. In the upper surface of each of the holding parts 102, a suction hole (not illustrated) for suction-holding the wafer W is provided.

At the base end portions of the first transfer arm 100 and the second transfer arm 101, an arm drive part 110 is provided. By means of the arm drive part 110, each of the transfer arms 100, 101 can independently move in the horizontal direction. The transfer arms 100, 101 and the arm drive part 110 are supported on a base 111. Below the base 111, a rotation drive part 112 is provided. The base 111 is connected to the rotation drive part 112 via a shaft 113 provided on the lower surface of the base 111. By means of the rotation drive part 112, the base 111 and the transfer arms 100, 101 can rotate about the shaft 113 as a center axis. Further, the rotation drive part 112 is configured to be movable in the horizontal direction on the transfer path 20 in the wafer transfer section 11.

Figure 6:
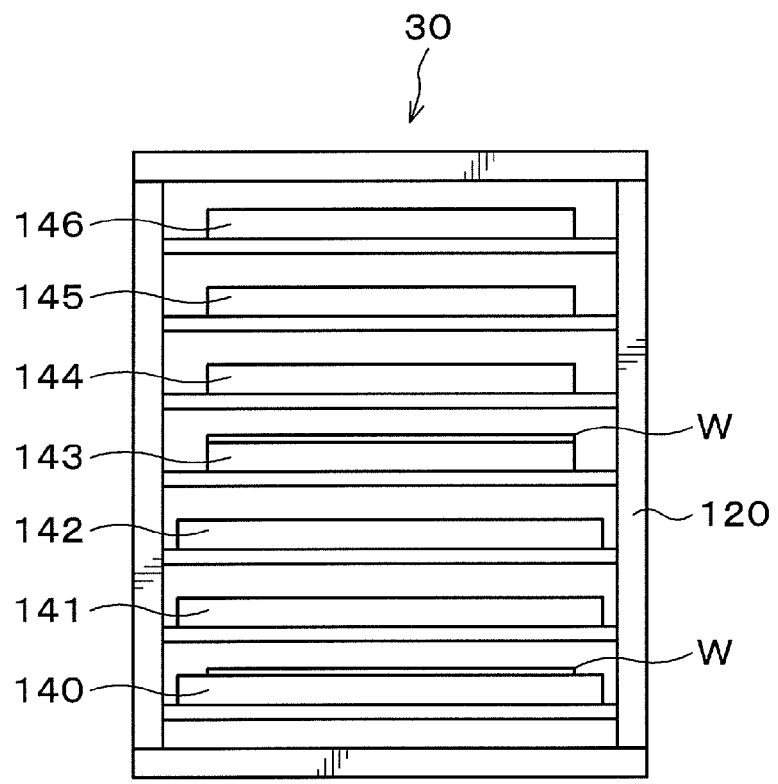
FIG. 6 is a front view illustrating the outline of a configuration of a delivery unit.
Figure 7:
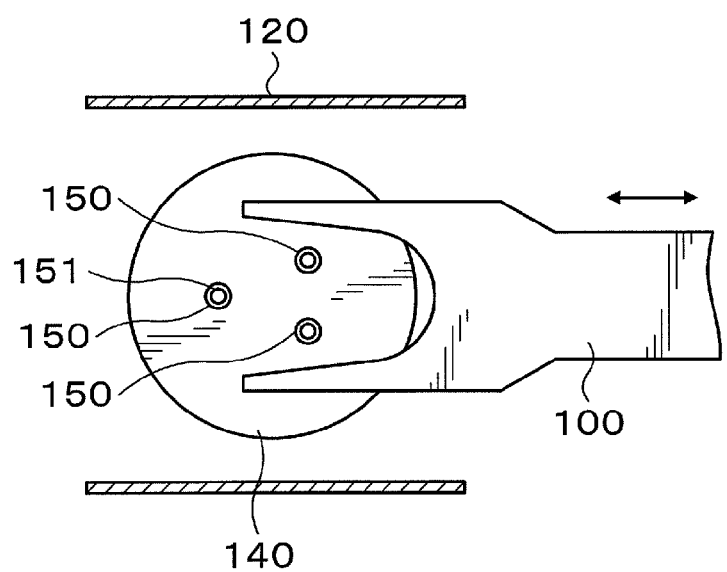
FIG. 7 is a plan view illustrating the outline of configurations of a plate and a transfer arm.
Figure 8:
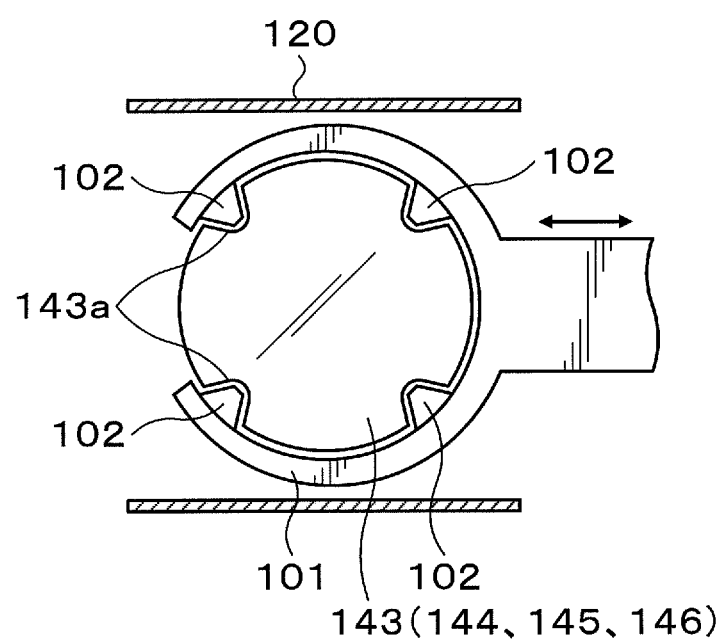
FIG. 8 is a plan view illustrating the outline of configurations of a plate and a transfer arm.

Next, the configuration of the delivery unit 30 will be described. FIG. 6 is a side view illustrating the outline of the configuration of the delivery unit 30, and FIG. 7 and FIG. 8 are transverse sectional views illustrating the outline of the configuration of the delivery unit 30.

The delivery unit 30 has a housing 120 in a shape of a rectangular column opening in surfaces on the sides of the wafer transfer mechanism 21 and the treatment station 3, for example, as illustrated in FIG. 6. The transfer arms 100, 101 of the wafer transfer mechanism 21 and the transfer arms of the wafer transfer mechanisms 70 to 72 freely access the inside of the delivery unit 30 through the openings.

Inside the housing 120, a plurality of plates 140 to 146 each of which holds the wafer W are provided stacked in the vertical direction. The plate 140 is, for example, a temperature regulation plate that mounts and temperature-regulates the wafer W thereon. The plate 140 has an almost disk shape as illustrated in FIG. 7. The plate 140 has a horizontal upper surface which is provided with, for example, a suction hole (not illustrated) for suction-holding the wafer W.

A temperature regulation member (not illustrated) such as a Peltier element for temperature regulation is embedded in the plate 140 and can regulate the temperature of the wafer W mounted on the plate 140 to a predetermined temperature, for example, 23° C.

The plate 140 is formed with a plurality of through holes 150 penetrating in the up-down direction thereof. In the through holes 150, raising and lowering pins 151 are provided. The raising and lowering pins 151 can move up and down by means of a raising and lowering drive mechanism (not illustrated) such as a cylinder. The raising and lowering pins 151 can pass through the through holes 150 and project from the upper surface of the plate 140 to support and raise and lower the wafer W. Accordingly, the first transfer arm 100 moves up and down, whereby the wafer W can be delivered between the first transfer arm 100 and the raising and lowering pins 151. The configurations of the plates 141, 142 are the same as that of the plate 140.

The plate 143 is, for example, a cooling plate that mounts and cools the wafer W thereon. A coolant flow path (not illustrated) in which a coolant for cooling flows is formed inside the plate 143 and can cool the wafer W mounted on the plate 143.

At the outer peripheral portion of the plate 143, for example, recessed parts 143a each recessed in a hollow shape corresponding to the shape of the holding part 102 of the second transfer arm 101 in a plan view are provided at predetermined intervals along the circumferential direction as illustrated in FIG. 8. Accordingly, the second transfer arm 101 moves up and down relative to the plate 143, whereby the wafer W can be delivered between the second transfer arm 101 and the plate 143. The configurations of the plates 144 to 144 are the same as that of the plate 143.

The configuration of the delivery unit 31 is the same as that of the delivery unit 30, and therefore the description thereof is omitted. In the delivery unit 32, 33, seven plates that have the same configuration as that of the plate 143 are provided only, and the other configuration is the same as that of the delivery unit 30. In this case, the wafer W in the delivery unit 32, 33 is not transferred to/from the cassette C by the first transfer arm 100, but is transferred only between the tiers in the delivery block 22 by the second transfer arm 101. Further, the delivery unit 34, 35, seven plates that have the same configuration as that of the plate 140 are provided only, and the other configuration is the same as that of the delivery unit 30. In this case, the wafer W in the delivery unit 34, 35 is transferred only to/from the cassette C by the first transfer arm 100.

Specifically, in the wafer transfer mechanism 21 and the delivery block 22 having the above-described configurations, the wafer transfer between the cassette C and the delivery unit 30, 31 and the wafer transfer between the cassette C and the delivery unit 34, 35 are performed by the first transfer arm 100 of the wafer transfer mechanism 21. Further, the wafer transfer between the delivery unit 30, 31 and the delivery unit 32, 33 is performed by the second transfer arm 101. Note that the configuration of the delivery block 22 is not limited to this embodiment, but the arrangement and the numbers of the delivery units 30 to 35 in the delivery block 22 and the arrangement and the numbers of the plates 140 to 146 in the delivery units 30 to 35 can be arbitrarily decided.

Further, the transfer of the wafer W by the wafer transfer mechanism 21 is controlled by the control unit 6 so that the treatment efficiency of the wafer W in the treatment units in the substrate treatment system 1 is maximized. Specifically, for example, when the timing to transfer the wafer W between the cassette C and the delivery unit 30 by the first transfer aim 100 overlaps with the timing to transfer the wafer W from the delivery unit 30 to the delivery unit 32 by the second transfer arm 101, any one of the wafers W is preferentially transferred and the other wafer W is kept waiting until the transfer of the preferentially transferred wafer W is completed. In this event, the control unit 6 selects the wafer W to be preferentially transferred so that the time in the waiting state is minimized, in other words, that decrease in throughput in the substrate treatment system 1 due to generation of the waiting state is minimized.

The control unit 6 is composed of a computer including, for example, a CPU and a memory. In the control unit 6, a treatment recipe in which contents of the wafer treatment in the various treatment units in the substrate treatment system 1 and the transfer route of each wafer W are stored as a program, for example, in a memory. By executing the program, the control unit 6 controls the operations of the various treatment units and the aforementioned wafer transfer mechanisms in the substrate treatment system 1 and thereby controls the various kinds of treatments and transfer of the wafers W in the substrate treatment system 1. Note that the program may be the one that is stored, for example, in a computer-readable storage medium H such as a computer-readable hard disk (HD), flexible disk (FD), compact disk (CD), magneto-optical disk (MO), or memory card, and installed from the storage medium H into the control unit 6.

Figure 9:
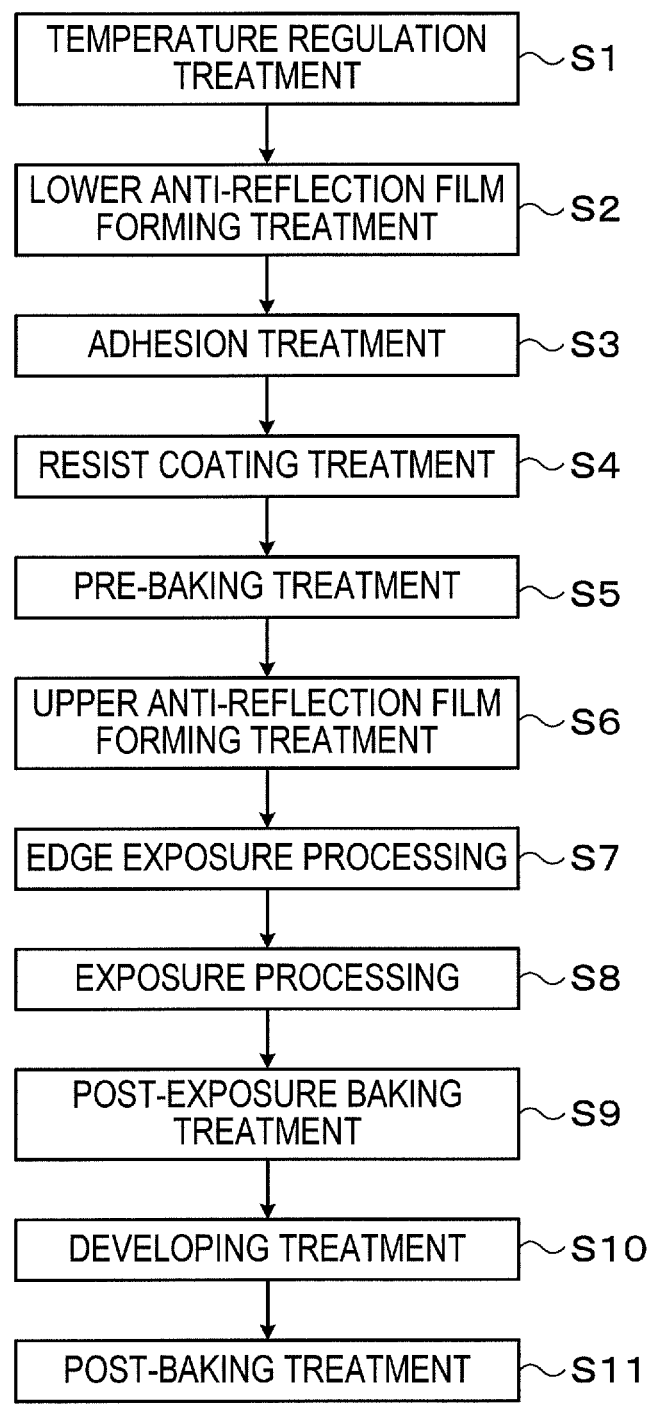
FIG. 9 is a flowchart illustrating main steps of wafer treatment performed in the substrate treatment system.

In substrate treatment system 1 configured as described above, for example, the following wafer treatment is performed. FIG. 9 is a flowchart illustrating main steps of the wafer treatment.

For the treatment on the wafer W, the cassette C housing a plurality of wafers W in one lot therein is mounted on a predetermined cassette mounting plate 13 in the cassette section 2. Then, the wafers W in the cassette C are successively taken out by the first transfer arm 100 of the wafer transfer mechanism 21 and transferred, for example, to the delivery unit 30 in the delivery block 22. The wafer W transferred into the delivery unit 30 is mounted, for example, on the plate 140 and temperature-regulated to a predetermined temperature (Step S1 in FIG. 9).

Then, the wafer W is transferred by the wafer transfer mechanism 70 to the lower anti-reflection film forming unit 40 in the first block G1, where a lower anti-reflection film is formed on the wafer W (Step S2 in FIG. 9). The wafer W is then transferred to the thermal treatment unit 50 in the second block G2 and subjected to heat treatment. The wafer W is then transferred to the adhesion unit 53 and subjected to adhesion treatment (Step S3 in FIG. 9).

The wafer W is then returned by the wafer transfer mechanism 70 to the delivery unit 30 and mounted on the plate 143. The wafer W mounted on the plate 143 is cooled to a predetermined temperature, and then transferred by the second transfer arm 101 of the wafer transfer mechanism 21 to the delivery unit 32 in the delivery block 22. The wafer W is then transferred by the wafer transfer mechanism 71 to the resist coating unit 41, where a resist film is formed on the wafer W (Step S4 in FIG. 9).

The wafer W is then transferred by the wafer transfer mechanism 71 to the thermal treatment unit 51 and subjected to pre-baking treatment (Step S5 in FIG. 9). Then, the wafer W is transferred by the wafer transfer mechanism 71 to the upper anti-reflection film forming unit 42 in the same second block G2, where an upper anti-reflection film is formed on the wafer W (Step S6 in FIG. 9).

The wafer W is then transferred by the wafer transfer mechanism 71 to the thermal treatment unit 51 and heated and temperature-regulated. Subsequently, the wafer W is transferred to the edge exposure unit 54 and subjected to edge exposure processing (Step S7 in FIG. 9).

The wafer W is then transferred by the wafer transfer mechanism 71 to the delivery unit 62 in the third block G3. The wafer W transferred to the delivery unit 62 is transferred by the wafer transfer mechanism 90 in the interface station 5 to the exposure unit 4 and subjected to exposure processing (Step S8 in FIG. 9).

The wafer W is then transferred by the wafer transfer mechanism 90 to the delivery unit 64 in the third block G3. The wafer W is then transferred by the wafer transfer mechanism 72 to the thermal treatment unit 52 in the second block G2 and subjected to post-exposure baking treatment (Step S9 in FIG. 9). The wafer W is then transferred by the wafer transfer mechanism 72 to the developing treatment unit 43 and developed (Step S10 in FIG. 9). After development, the wafer W is then transferred to the thermal treatment unit 52 and subjected to post-baking treatment (Step S11 in FIG. 9).

The wafer W is then transferred by the wafer transfer mechanism 72 to the delivery unit 34 in the delivery block 22. The wafer W in the delivery unit 34 is transferred by the first transfer arm 100 of the wafer transfer mechanism 21 to the cassette C on a predetermined cassette mounting plate 13. Thus, a series of photolithography processes end.

Figure 18:
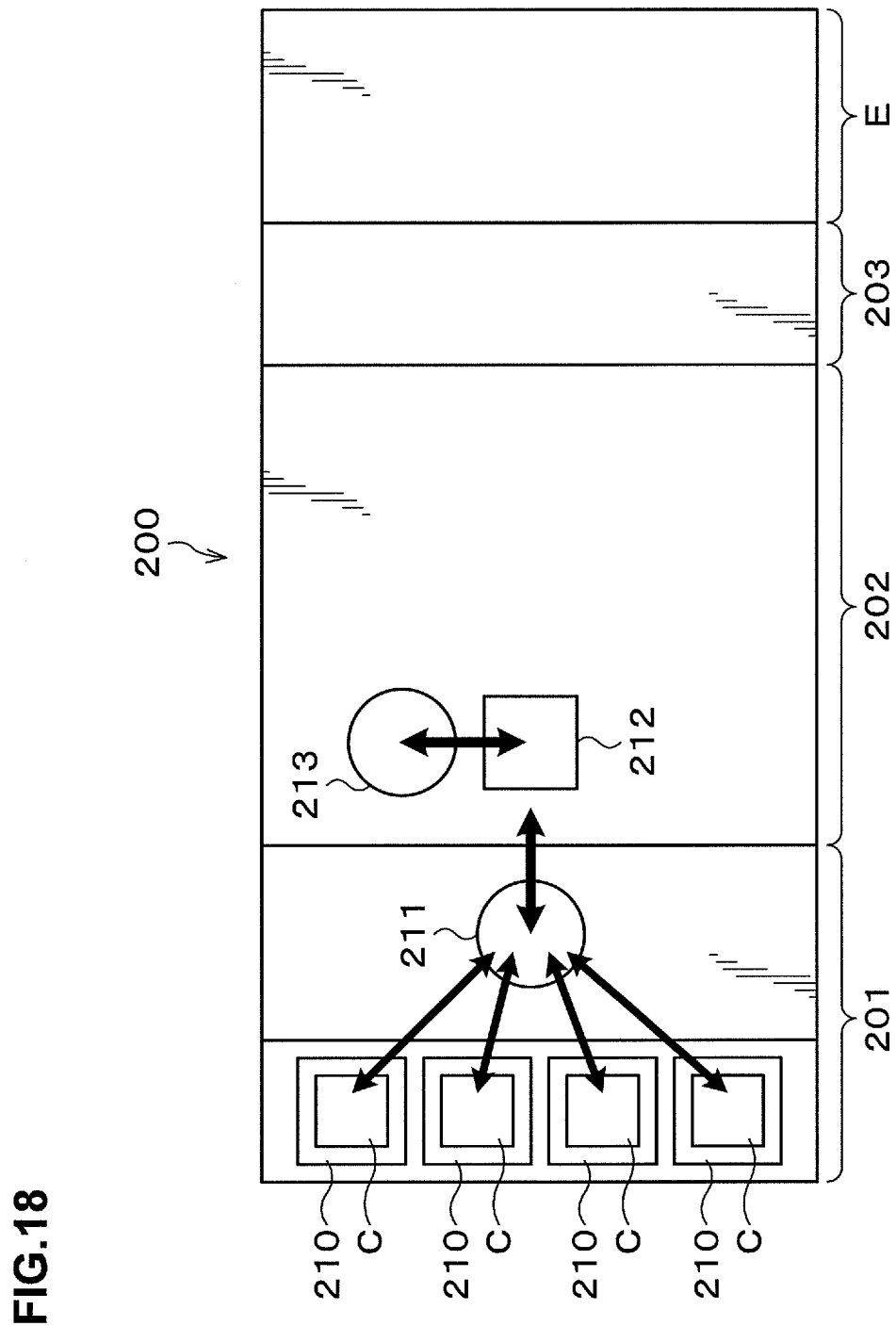
FIG. 18 is a plan view illustrating the outline of an internal configuration of a conventional substrate treatment system.

According to this embodiment, since the wafer transfer mechanism 21 arranged between the treatment station 3 and the cassette mounting table 12 has the first transfer arm 100 and the second transfer arm 101, the wafer transfer between the cassette C on the cassette mounting table 12 and each of the delivery units 30 to 35 and the wafer transfer between the tiers of the delivery units 30 to 35 can be performed by the wafer transfer mechanism 21. Therefore, another wafer transfer mechanism 213 illustrated, for example, in FIG. 18 which has been conventionally provided for exclusive use for the wafer transfer between the tiers of the delivery units 30 to 35 becomes unnecessary. Therefore, the constraint when changing the arrangement of the delivery block 22 closer to the cassette mounting table 12 is eliminated and the delivery block 22 can be arranged closer to the cassette mounting table 12 than ever before. Consequently, the footprint of the substrate treatment system 1 can be reduced.

Further, for example, the delivery units 30 to 35 are composed of the plates 140 to 146 each having the temperature regulation function and the cooling function and therefore can temperature-regulate and cool the wafer W during transfer of the wafer W. This makes it possible to improve the throughput of the wafer treatment in the substrate treatment system 1. It is also possible to reduce the units for temperature regulation and the units for cooling which are provided in the conventional treatment station 3. Therefore, the treatment station 3 can be downsized and the footprint of the substrate treatment system 1 can be further reduced.

Figure 10:
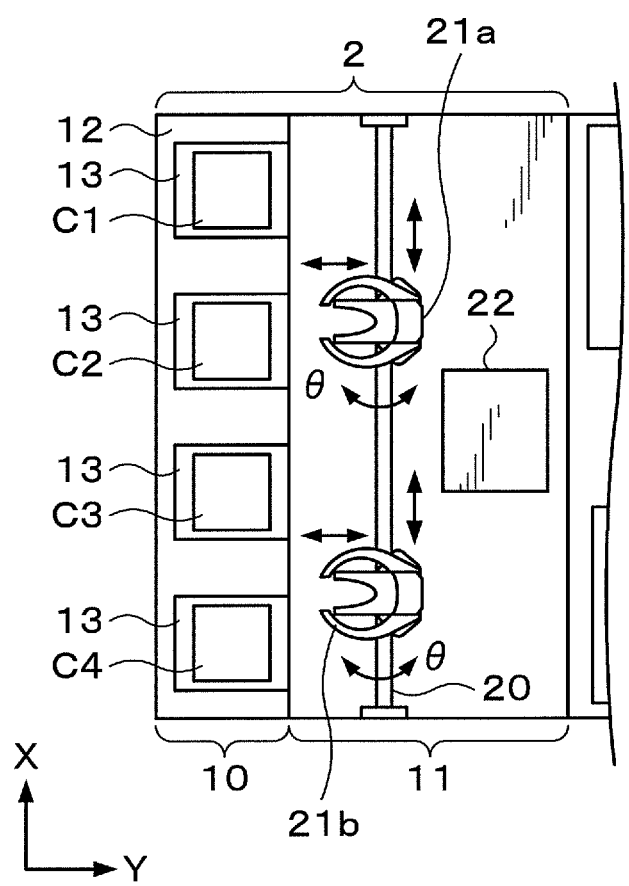
FIG. 10 is a plan view illustrating the outline of a configuration of a cassette station when a plurality of wafer transfer mechanisms are provided in the horizontal direction.
Figure 11:
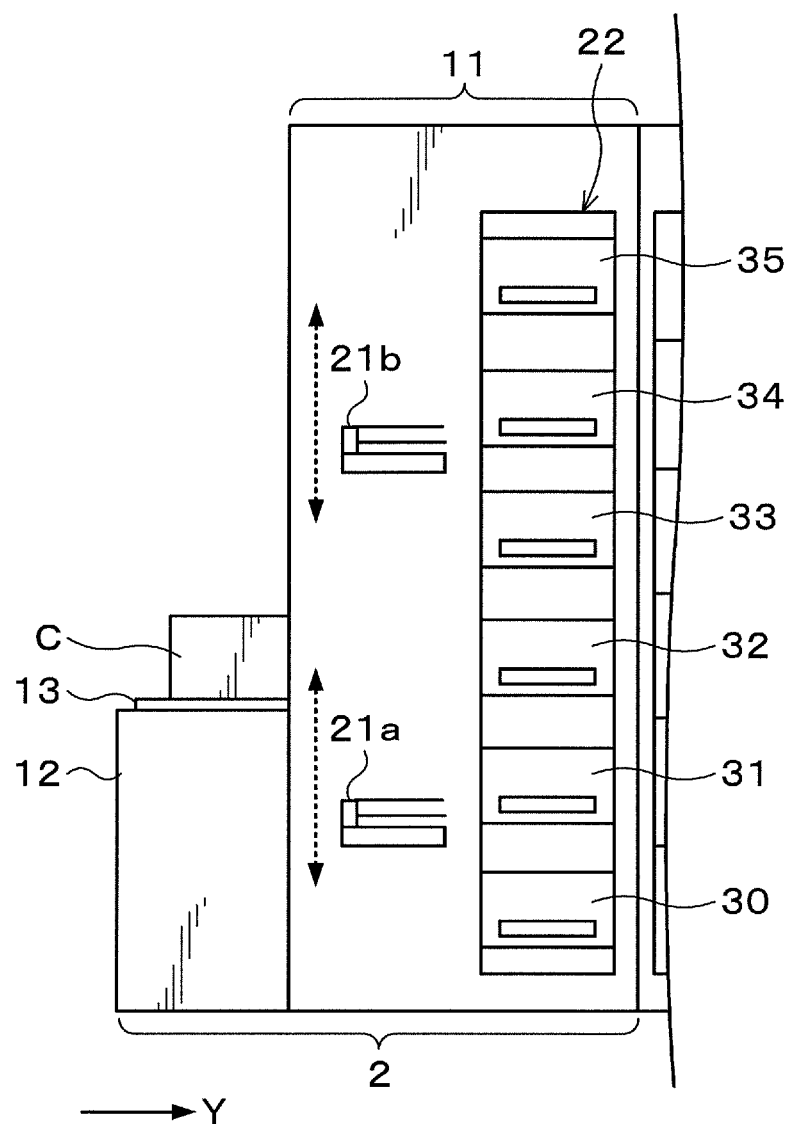
FIG. 11 is a side view illustrating the outline of a configuration of a cassette station when a plurality of wafer transfer mechanisms are provided in the up-down direction.

Note that though the example in which one wafer transfer mechanism 21 is provided in the cassette station 2 has been described in the above embodiment, for example, the timing to transfer the wafer W between the cassette C and the delivery unit 30 by the first transfer arm 100 sometimes overlaps with the timing to transfer the wafer W from the delivery unit 31 to the delivery unit 32 by the second transfer arm 101 as has been described. In this case, any one of the wafers W is preferentially transferred and the other wafer W is kept waiting until the transfer of the preferentially transferred wafer W is completed. To avoid the waiting state, a plurality of wafer transfer mechanisms 21 may be provided. Specifically, a plurality of wafer transfer mechanisms 21a, 21b independently movable in the vertical direction and the horizontal direction may be provided on the transfer path 20 such that the moving routes in the horizontal direction of the wafer transfer mechanisms 21a, 21b overlap with each other in a plan view as illustrated in FIG. 10. Further, a plurality of wafer transfer mechanisms 21a, 21b may be provided in the up-down direction, for example, as illustrated in FIG. 11.

FIG. 10 illustrates a case where the wafer transfer mechanisms 21a, 21b are arranged side by side along the transfer path 20 as the example in which the moving routes in the horizontal direction of the plurality of wafer transfer mechanisms 21a, 21b overlap with each other in a plan view. In this case, the wafer W may be transferred between the cassette C1, C2 and the delivery unit 30 to 35 by the wafer transfer mechanism 21a that is provided closer to the cassettes C1, C2 (on an X-direction positive direction side in FIG. 10) and the wafer W may be transferred between the cassette C3, C4 and the delivery unit 30 to 35 by the wafer transfer mechanism 21b that is provided closer to the cassettes C3, C4 (on an X-direction negative direction side in FIG. 10). This makes it possible to minimize the moving distance along the transfer path 20 of each of the wafer transfer mechanisms 21a, 21b, namely, the moving distance in the horizontal direction, so as to efficiently transfer the wafer W.

Figure 15:
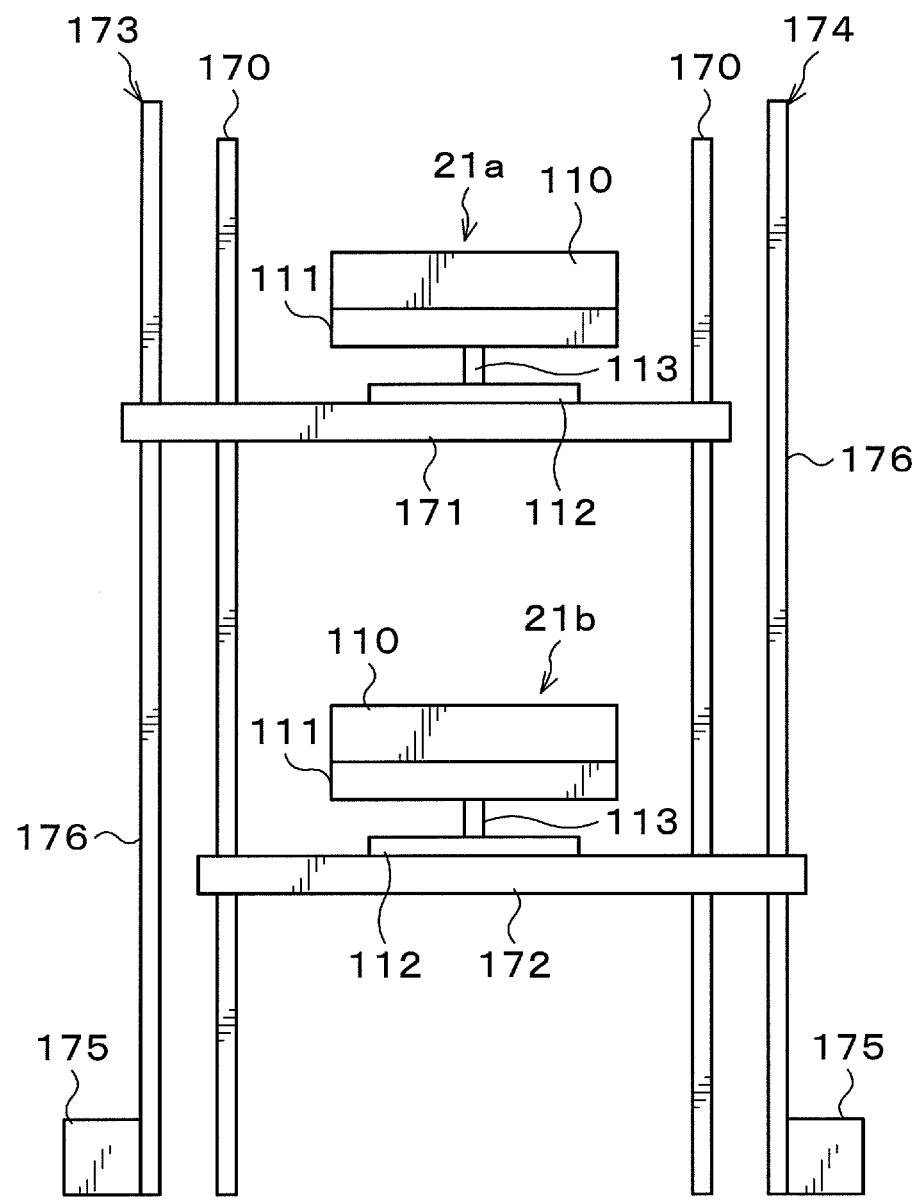
FIG. 15 is a rear view illustrating the outline of a configuration in the vicinity of wafer transfer mechanisms when a plurality of wafer transfer mechanisms are provided in the up-down direction.

Further, the provision of the plurality of wafer transfer mechanisms 21a, 21b ensures that even when one of them, for example, the wafer transfer mechanism 21a fails, the transfer of the wafer W can be continued by the sound wafer transfer mechanism 21b without failure. In this case, it is preferable to move the failed wafer transfer mechanism 21a, for example, to a retreat position at the end portion on the X-direction positive direction side of the transfer path 20 to prevent the failed wafer transfer mechanism 21a from interfering with the sound wafer transfer mechanism 21b. Note that for arranging the transfer mechanisms 21a, 21b in the up-down direction, they do not need to be arranged on the same vertical line as illustrated in FIG. 11 and FIG. 15 but may be arranged such that the wafer transfer mechanism 21a and the wafer transfer mechanism 21b arranged one above the other partially overlap with each other in a plan view.

Note that in the case where the plurality of wafer transfer mechanisms 21a, 21b are provided, any of the wafer transfer mechanism 21a and the wafer transfer mechanism 21b may be used for the transfer of the wafer W between the tiers of the delivery units 30 to 35 depending on the situation. Specifically, for example, even when the timing to transfer the wafer W between the cassette C1 and the delivery unit 34 by the first transfer arm 100 of the wafer transfer mechanism 21a overlaps with the timing to transfer the wafer W between the tiers of the delivery units 30, 32 by the second transfer arm 101, for example, the transfer of the wafer W between the tiers of the delivery units 30, 32 may be performed by the second transfer arm 101 of the wafer transfer mechanism 21b when the wafer transfer mechanism 21b is not transferring a wafer or when the waiting time of a wafer W is reduced further by the transfer by the wafer transfer mechanism 21b. This enables the transfer of the wafers W in the substrate treatment system 1 without delay.

Figure 12:
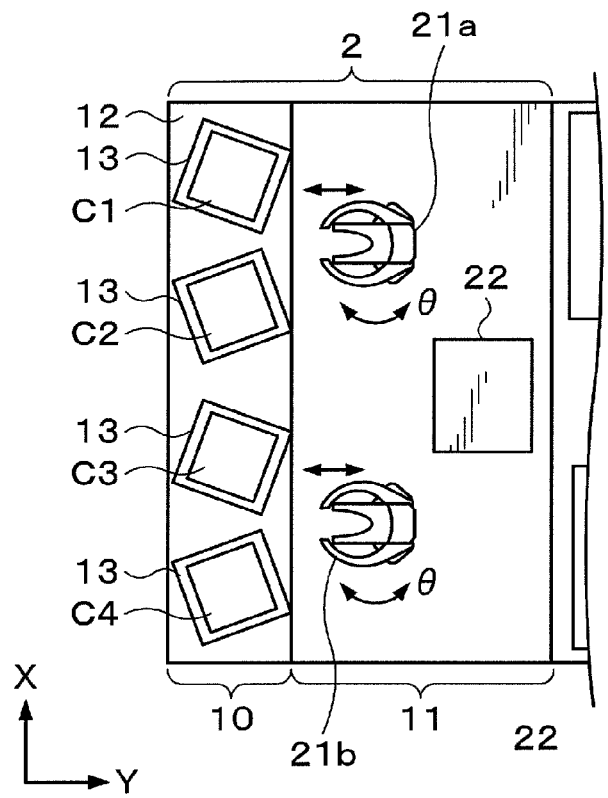
FIG. 12 is a plan view illustrating the outline of a configuration of a cassette station when a plurality of wafer transfer mechanisms are provided in the horizontal direction.

Note that though FIG. 10 illustrates the case where the plurality of wafer transfer mechanisms 21a, 21b are provided on the transfer path 20, the transfer path 20 does not always need to be provided in the case where the plurality of wafer transfer mechanisms 21a, 21b are provided. In other words, the wafer transfer mechanisms 21a, 21b do not need to be moved along the X-direction in FIG. 10. In this case, the wafer transfer mechanism 21a may be provided between the cassettes C1, C2 and the delivery block 22, and the wafer transfer mechanism 21b may be provided between the cassettes C3, C4 and the delivery block 22, for example, as illustrated in FIG. 12. In this event, it is preferable to arrange the cassettes C1 to C4 directed to the direction of the center of the rotation axes of the wafer transfer mechanisms 21a, 21b. Further, the openings on the cassette mounting table 12 side formed in the casings 120 of the delivery units 30 to 35 are configured so that the transfer arms 100, 101 of the wafer transfer mechanisms 21a, 21b can access the wafers W therein from oblique directions. This eliminates the movement in the X-direction of the wafer transfer mechanisms 21a, 21b and thus eliminates the provision of the transfer path 20.

Figure 13:
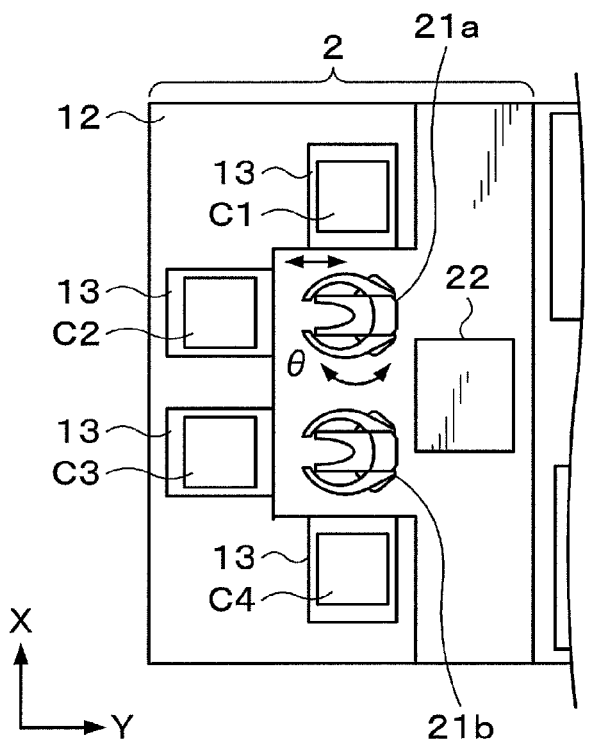
FIG. 13 is a plan view illustrating the outline of a configuration of a cassette station when a plurality of wafer transfer mechanisms are provided in the horizontal direction.

Further, the arrangement of the cassettes C1 to C4 themselves may be made such that the line of the arrangement of the cassettes C1, C2 and the wafer transfer mechanism 21a is in an almost L-shape in a plan view as illustrated, for example, in FIG. 13.

Figure 14:
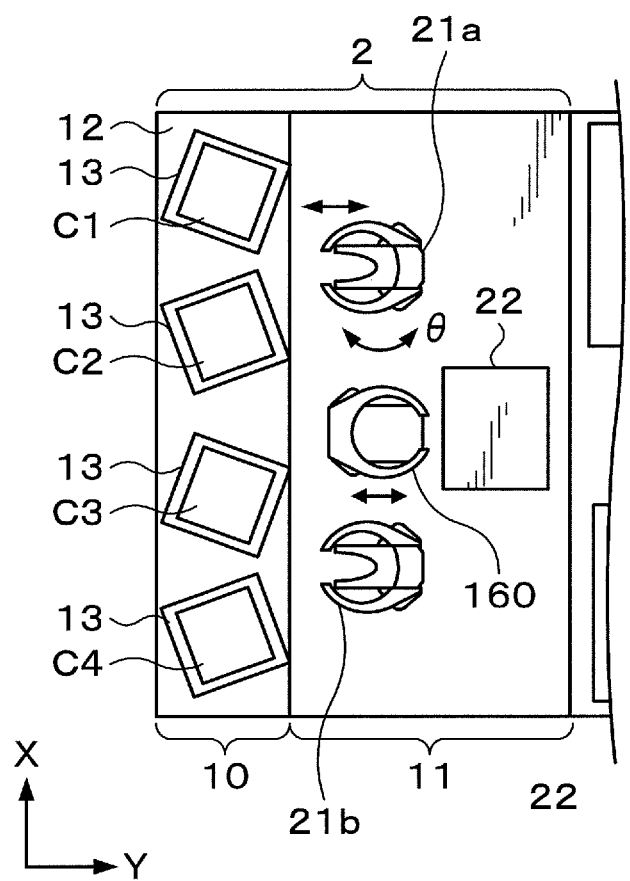
FIG. 14 is a plan view illustrating the outline of a configuration of a cassette station when a plurality of wafer transfer mechanisms are provided in the horizontal direction.

Further, when the plurality of wafer transfer mechanisms 21a, 21b are arranged side by side in the horizontal direction in a plan view, a substrate transfer mechanism 160 that transfers the wafer W between the tiers in the delivery block 22 may be provided, for example, as illustrated in FIG. 14 between the wafer transfer mechanisms 21a, 21b in a plan view. The substrate transfer mechanism 160 includes, for example, a transfer arm having the same configuration as that of the second transfer arm 101 of the wafer transfer mechanism 21 and is movable in the horizontal direction and the up-down direction. In this case, even if the transfer of the wafer W between the tiers of the delivery units 30 to 35 becomes necessary when both the wafer transfer mechanism 21a and the wafer transfer mechanism 21b transfer the wafers W, the substrate transfer mechanism 160 performs the transfer of the wafer W between the tiers and thereby can perform the transfer of the wafers W without delay in the substrate treatment system 1.

Next, the configurations of the plurality of wafer transfer mechanisms 21a, 21b arranged in the up-down direction as illustrated in FIG. 11 will be described.

The wafer transfer mechanisms 21a, 21b are supported by lift tables 171, 172 respectively provided to be slidable in the vertical direction on direct-acting rails 170, 170 extending in parallel in the vertical direction as illustrated, for example, in FIG. 15. The lift tables 171, 172 can be independently lifted up and down by lift mechanisms 173, 174 provided in parallel along the direct-acting rails 170, 170. The lift mechanism 173, 174 is configured by combining, for example, a motor 175 and a pulley 176 and can control lift up and down of the lift table 171, 172 by controlling forward rotation and reverse rotation of the motor 175. On the upper surfaces of the lift tables 171, 172, the rotation drive units 112, 112 of the wafer transfer mechanisms 21a, 21b are supported respectively. This enables independent rotation operation and lift-up/down operation of the bases 111 of the wafer transfer mechanisms 21a, 21b.

Also in the case where the plurality of wafer transfer mechanisms 21a, 21b are arranged in the up-down direction as described above, even when one of them, for example, the wafer transfer mechanism 21a fails, the transfer of the wafer W can be continued by the sound wafer transfer mechanisms 21b. In this case, it is preferable to move the failed wafer transfer mechanisms 21a, for example, to the retreat position at the upper end portion of the direct-acting rail 170 to prevent the failed wafer transfer mechanisms 21a from interfering with the sound wafer transfer mechanisms 21b. Note that for arranging the plurality of wafer transfer mechanisms 21a, 21b in the up-down direction, they do not need to be arranged on the same vertical line as illustrated, for example, in FIG. 11 and FIG. 15 but may be arranged, for example, such that the wafer transfer mechanism 21a and the wafer transfer mechanism 21b arranged in the up-down direction partially overlap with each other in a plan view.

Figure 16:
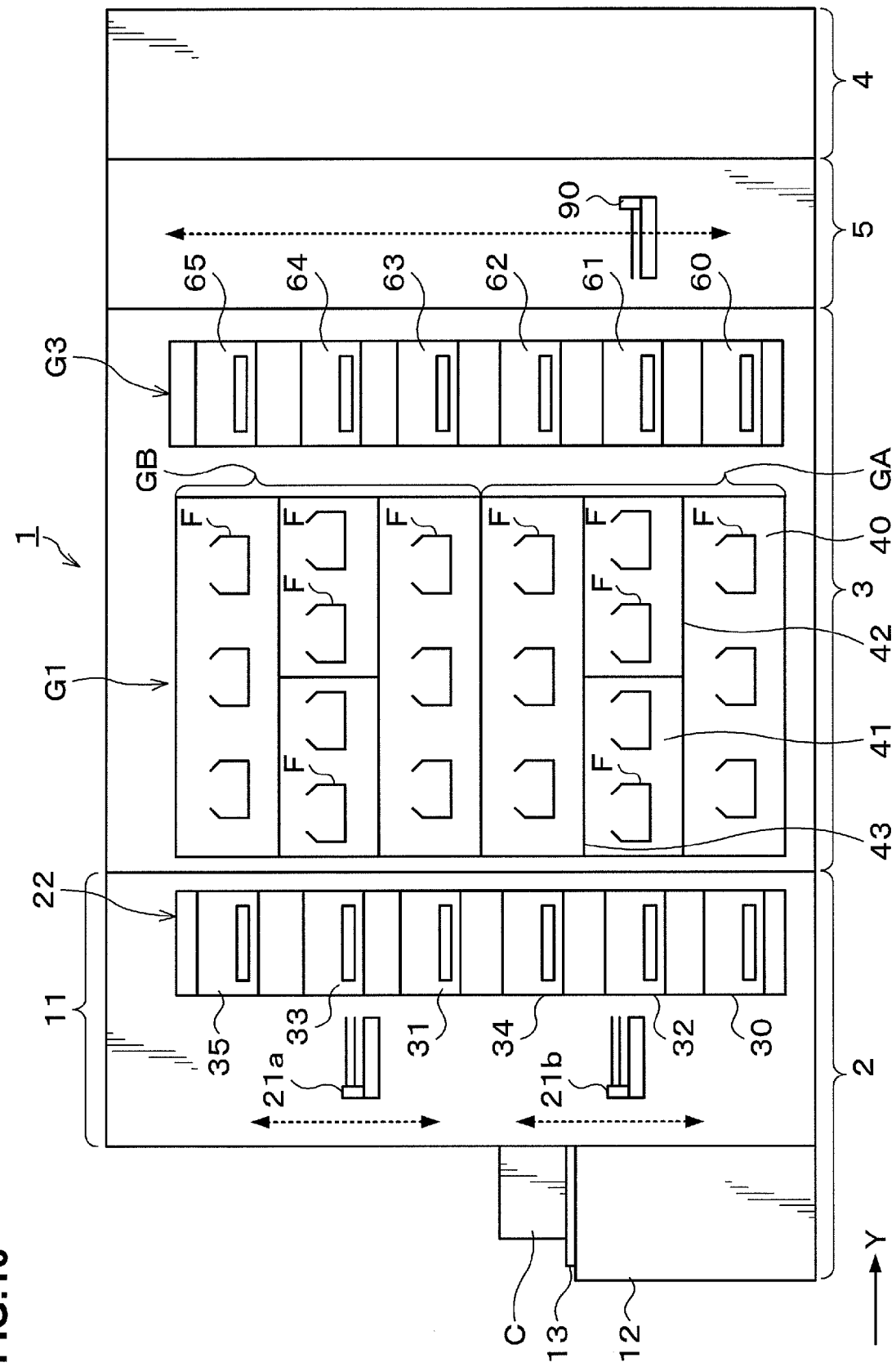
FIG. 16 is a side view illustrating the outline of an internal configuration of a substrate treatment system according to another embodiment.

Note that though the treatment units 40 to 43 are arranged at two upper and lower tiers each according to the order of treatments on the wafer W as illustrated in FIG. 2, for example, in the case of the first block G1 in the above embodiment, the arrangement and the numbers of treatment units installed in the first block G1 and the second block G2 are appropriately set according to the number and the arrangement of the installed wafer transfer mechanisms 21 and not limited to the contents of this embodiment. In particular, when the plurality of wafer transfer mechanisms 21a, 21b are arranged on the same vertical line as illustrated in FIG. 11, the treatment units 40 to 43 may be arranged so that the moving distance in the up-down direction of the wafer W between the treatment units 40 to 43 is minimized. Specifically, for example, in the case of the first block G1, a treatment unit group GA in which the lower anti-reflection film forming unit 40, the resist coating unit 41, the upper anti-reflection film forming unit 42, and the developing treatment unit 43 may be arranged at one tier each in order from the bottom according to the order of treatments on the wafer W is arranged, and a treatment unit group GB having the same configuration as that of the treatment unit group GA may be further arranged on top of the developing treatment unit 43 in the treatment unit group GA, for example, as illustrated in FIG. 16. At this time, the delivery units 30 to 35 are also arranged in the order of the delivery units 30, 32, 34, 31, 33, 35 from the bottom to the top according to the corresponding treatment units.

Figure 17:
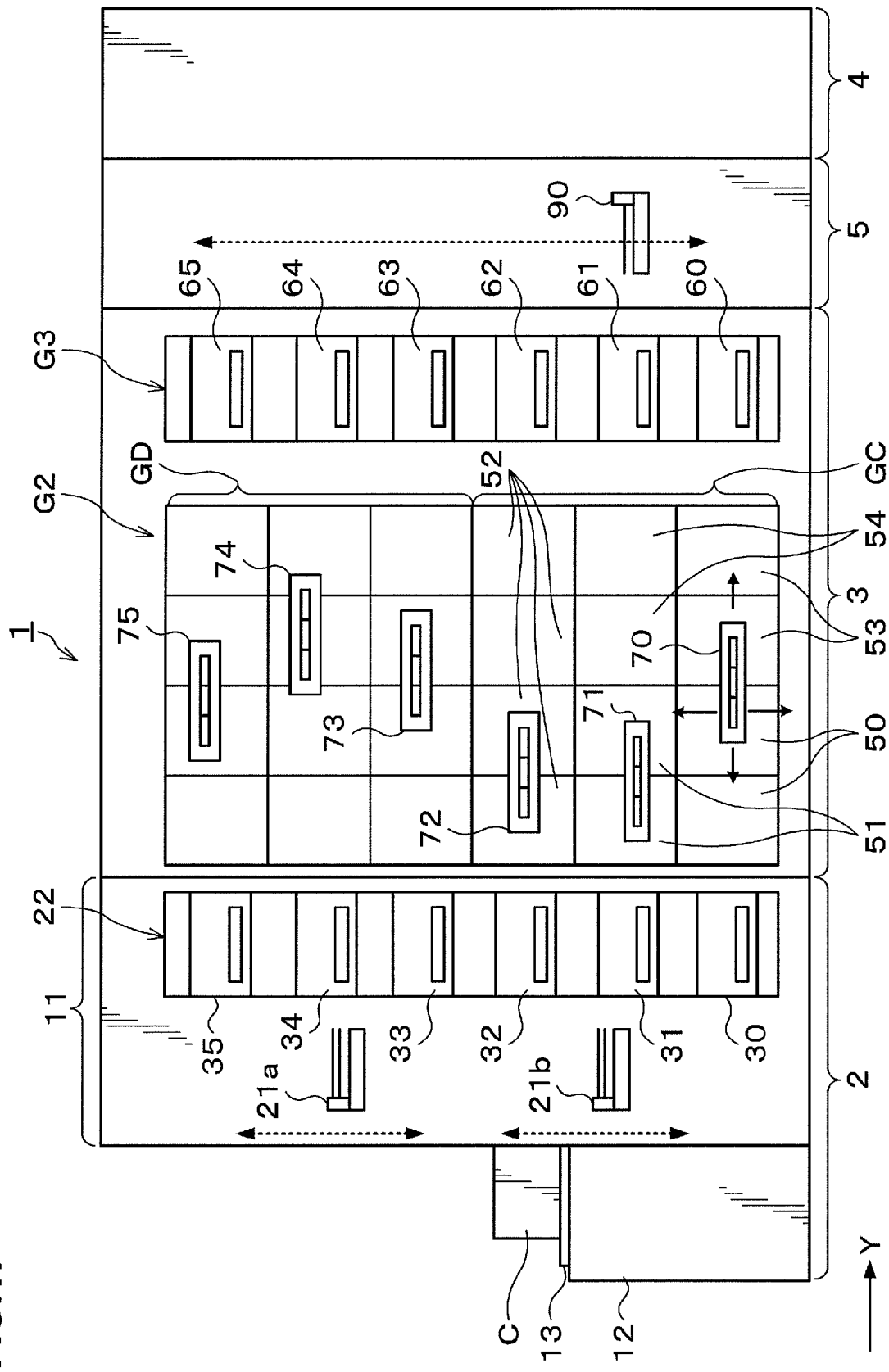
FIG. 17 is a side view illustrating the outline of the internal configuration of the substrate treatment system according to another embodiment.

Further, for example, in the case of the second block G2, a treatment unit group GC in which the thermal treatment units 50 to 52 each of which performs thermal treatment on the wafer W, the adhesion units 53 each of which performs hydrophobic treatment on the wafer W, and the edge exposure units 54 each of which exposes the outer peripheral portion of the wafer W may be arranged one on top of the other in the vertical direction and side by side in the horizontal direction according to the order of treatments on the wafer W similarly to the aforesaid treatment units 40 to 43 is arranged, and a treatment unit group GD having the same configuration as that of the treatment unit group GC may be arranged on top of the treatment unit group GC as illustrated in FIG. 17.

In this case, it is preferable that the wafer transfer mechanism 21b arranged at a lower part performs the transfer of the wafer W relating to the treatment unit groups GA, GC, in other words, the transfer of the wafer W relating to the delivery units 30, 32, 34 arranged at the lower half of the delivery block 22, and the wafer transfer mechanism 21a arranged above the wafer transfer mechanism 21b performs the transfer of the wafer W relating to the treatment unit groups GB, GD. This reduces the moving distances in the up-down direction of the wafer transfer mechanisms 21a, 21b when transferring the wafer W and can efficiently transfer the wafer W.

Further, the plurality of wafer transfer mechanisms 21a, 21b are provided in the up-down direction, so that, for example, even when the timing to transfer the wafer W between the delivery unit 30 and the delivery unit 31 by the second transfer aim 101 of the wafer transfer mechanisms 21b overlaps with the timing to transfer the wafer W between the cassette C and the delivery unit 32 by the first transfer arm 100, the control unit 6 may control the wafer transfer mechanisms 21a, 21b so that, for example, the transfer between the tiers of the delivery units 30, 31 is performed by the second transfer arm 101 of the wafer transfer mechanism 21a, for example, when the wafer transfer mechanism 21a is not transferring a wafer or when the waiting time of a wafer W is reduced further by the transfer by the wafer transfer mechanism 21a. The provision of the plurality of wafer transfer mechanisms 21a, 21b in the up-down direction makes it possible to reduce the footprint of the substrate treatment system 1 without reducing the throughput of the substrate treatment system 1.

Note that though the delivery block 22 is provided in the wafer transfer section 11 in the above embodiment but may be provided, for example, between the treatment station 3 and the cassette station 2 or may be provided in the treatment station 3. In any case, another wafer transfer mechanism 213 illustrated in FIG. 18 which has been conventionally provided for exclusive use for the wafer transfer between the tiers of the delivery units 30 to 35 becomes unnecessary, so that the footprint of the substrate treatment system 1 can be reduced.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to the embodiments but may take various forms. The present invention is also applicable to the case where the substrate is a substrate other than the wafer, such as an FPD (Flat Panel Display), a mask reticle for a photomask or the like.

The present invention is useful in performing treatment on a substrate such as a semiconductor wafer.

What is claimed is:

1. A substrate treatment system comprising a treatment station having a plurality of treatment units which treat a substrate provided at multiple tiers in an up-down direction, a cassette mounting part on which a cassette housing a plurality of substrates is mounted, and a plurality of substrate transfer mechanisms arranged between the treatment station and the cassette mounting part,
   wherein a plurality of delivery units are provided at multiple tiers between said treatment station and said substrate transfer mechanisms, said delivery units temporarily housing a substrate to be transferred between said cassette mounting part and said treatment station and a substrate to be transferred between the tiers of said treatment units,
   wherein each of said substrate transfer mechanisms comprises a first transfer arm that transfers a substrate between said cassette mounting part and each of said delivery units, and a second transfer arm that transfers a substrate between the tiers of said delivery units,
   wherein said plurality of said substrate transfer mechanisms are provided side by side in a horizontal direction in a plan view, and
   wherein each of said substrate transfer mechanisms has a moving route along which the substrate transfer mechanism moves, and said plurality of said substrate transfer mechanisms are arranged such that the moving routes in the horizontal direction in the plan view overlap with each other.

2. The substrate treatment system as set forth in claim 1, wherein said plurality of substrate transfer mechanisms further are provided one above another in the up-down direction, and said plurality of substrate transfer mechanisms are arranged such that the moving routes in a vertical direction overlap with each other.

3. The substrate treatment system as set forth in claim 2, wherein said plurality of treatment units are arranged one above another in an order of treatments in the up-down direction such that a transfer route of the substrate to be treated in said treatment units is shortest, and
   wherein treatment unit groups arranged in the order of treatments are provided at least two tiers in the up-down direction in said treatment station.

4. The substrate treatment system as set forth in claim 1, wherein a substrate transfer apparatus that transfers a substrate between the tiers of said delivery units is arranged between said treatment units and said cassette mounting part and between said plurality of substrate transfer mechanisms.

5. The substrate treatment system as set forth in claim 1, further comprising:
   a control unit that controls an operation of said substrate transfer mechanism,
   wherein said control unit performs control such that when timing of substrate transfer by said first transfer arm overlaps with timing of substrate transfer by said second transfer arm, a substrate is preferentially transferred by any one of said transfer arms so that a time when a substrate is in a waiting state is minimized.

6. The substrate treatment system as set forth in claim 1, further comprising:
   a control unit that controls an operation of said substrate transfer mechanisms,
   wherein said control unit performs control such that when timing of substrate transfer by said first transfer arm overlaps with timing of substrate transfer by said second transfer arm, the substrate transfer by said first transfer arm between said cassette mounting part and each of said delivery units is preferentially performed, and transfer between the tiers of said delivery units is performed by another substrate transfer mechanism that is not transferring a substrate.

7. The substrate treatment system as set forth in claim 1, wherein said delivery unit has a plurality of plates on each of which a substrate is mounted, and each of said plates is a cooling plate that cools the substrate or a temperature regulation plate that performs temperature regulation on the substrate.

8. The substrate treatment system as set forth in claim 1, wherein said substrate transfer mechanism has an arm drive part that moves said first transfer arm and said second transfer arm in a horizontal direction and the up-down direction.

9. The substrate treatment system as set forth in claim 1, wherein a plurality of said substrate transfer mechanisms are provided one above another in the up-down direction.

10. The substrate treatment system as set forth in claim 1, wherein, in the plan view, the horizontal direction of the moving routes which overlap with each other is an X-direction parallel to the treatment station and the cassette mounting part.

11. A substrate transfer method in a substrate treatment system comprising a treatment station having a plurality of treatment units which treat a substrate provided at multiple tiers in an up-down direction, a cassette mounting part on which a cassette housing a plurality of substrates is mounted, and a plurality of substrate transfer mechanisms arranged between the treatment station and the cassette mounting part,
- wherein a plurality of delivery units are provided at multiple tiers between the treatment station and the substrate transfer mechanism, the delivery units temporarily housing a substrate to be transferred between the cassette mounting part and the treatment station and a substrate to be transferred between the tiers of the treatment units, comprising:
- controlling, by a control unit of the substrate treatment system, substrate transfer between the cassette mounting part and each of the delivery units to be performed by a first transfer arm of the substrate transfer mechanism, and substrate transfer between the tiers of the delivery units to be performed by a second transfer arm of the substrate transfer mechanism,
- wherein said plurality of said substrate transfer mechanisms are provided side by side in a horizontal direction in a plan view, and
- controlling, by the control unit, each of said substrate transfer mechanisms to have a moving route along which the substrate transfer mechanism moves, and said plurality of said substrate transfer mechanisms are arranged such that the moving routes in the horizontal direction in the plan view overlap with each other.

12. The substrate transfer method as set forth in claim 11, further comprising
- when timing of substrate transfer by the first transfer arm overlaps with timing of substrate transfer by the second transfer arm, controlling, by the control unit, the substrate transfer mechanisms to preferentially transfer a substrate by any one of the transfer arms so that a time when a substrate is in a waiting state is minimized.

13. The substrate transfer method as set forth in claim 12, wherein the plurality of substrate transfer mechanisms are provided one above another in the up-down direction, and said plurality of substrate transfer mechanisms are arranged such that the moving routes in a vertical direction overlap with each other.

14. The substrate transfer method as set forth in claim 13, wherein the plurality of treatment units are arranged one above another in an order of treatments in the up-down direction such that a transfer route of the substrate to be treated in the treatment units is shortest, and wherein treatment unit groups arranged in the order of treatments are provided at least two tiers in the up-down direction in the treatment station.

15. The substrate transfer method as set forth in claim 12, further comprising,
- when timing of substrate transfer by the first transfer arm overlaps with timing of substrate transfer by the second transfer arm, controlling, by the control unit, the substrate transfer mechanisms to preferentially perform the substrate transfer by the first transfer arm between the cassette mounting part and each of the delivery units, and
- controlling, by the control unit, the substrate transfer mechanisms to perform transfer between the tiers of the delivery units by another substrate transfer mechanism that is not transferring a substrate.

16. The substrate transfer method as set forth in claim 12, further comprising
- controlling, by the control unit, transfer between the tiers of the delivery units to be performed by a substrate transfer apparatus that is provided between the treatment units and the cassette mounting part and between the plurality of substrate transfer mechanisms and to perform substrate transfer between the tiers of the delivery units.

17. The substrate transfer method as set forth in claim 11, wherein the delivery unit has a plurality of plates on each of which a substrate is mounted, and each of the plates is a cooling plate that cools the substrate or a temperature regulation plate that performs temperature regulation on the substrate.

18. The substrate transfer method as set forth in claim 11, wherein a plurality of the substrate transfer mechanisms are provided one above another in the up-down direction.

19. The substrate transfer method as set forth in claim 11, wherein, in the plan view, the horizontal direction of the moving routes which overlap with each other is an X-direction parallel to the treatment station and the cassette mounting part.

20. A non-transitory computer-readable storage medium storing a program operating on a computer of a control unit controlling a substrate treatment system to cause the substrate treatment system to execute a substrate transfer method in the substrate treatment system comprising a treatment station having a plurality of treatment units which treat a substrate provided at multiple tiers in an up-down direction, a cassette mounting part on which a cassette housing a plurality of substrates is mounted, and a plurality of substrate transfer mechanisms arranged between the treatment station and the cassette mounting part, wherein a plurality of delivery units are provided at multiple tiers between the treatment station and the substrate transfer mechanism, the delivery units temporarily housing a substrate to be transferred between the cassette mounting part and the treatment station and a substrate to be transferred between the tiers of the treatment units, the program causes the control unit to:
- control substrate transfer between the cassette mounting part and each of the delivery units to be performed by a first transfer arm of the substrate transfer mechanism, and control substrate transfer between the tiers of the delivery units to be performed by a second transfer arm of the substrate transfer mechanism,
- wherein the plurality of said substrate transfer mechanisms are provided side by side in a horizontal direction in a plan view, and
- control each of said substrate transfer mechanisms to have a moving route along which the substrate transfer mechanism moves, and said plurality of said substrate transfer mechanisms are arranged such that the moving routes in the horizontal direction in the plan view overlap with each other.

\* \* \* \* \*